United States Patent
Yen

(10) Patent No.: US 7,309,625 B2
(45) Date of Patent: Dec. 18, 2007

(54) METHOD FOR FABRICATING METAL OXIDE SEMICONDUCTOR WITH LIGHTLY DOPED DRAIN

(75) Inventor: Shih-Yi Yen, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 269 days.

(21) Appl. No.: 11/256,855

(22) Filed: Oct. 24, 2005

(65) Prior Publication Data
US 2006/0205126 A1    Sep. 14, 2006

(30) Foreign Application Priority Data
Mar. 9, 2005    (TW) .............................. 94107099 A

(51) Int. Cl.
*H01L 21/84* (2006.01)
(52) U.S. Cl. ..................... 438/149; 438/154; 438/163

(58) Field of Classification Search ................ 438/149, 438/154, 163
See application file for complete search history.

(56) References Cited

U.S. PATENT DOCUMENTS

2004/0229416 A1* 11/2004 Shih .......................... 438/164
2006/0076618 A1*  4/2006 Kang ......................... 257/336

* cited by examiner

*Primary Examiner*—Jack Chen
(74) *Attorney, Agent, or Firm*—Thomas, Kayden, Horstemeyer & Risley

(57) ABSTRACT

A method for fabricating metal oxide semiconductor with lightly doped drain. In the method, the gate electrode, the LDD of the n-type MOS TFT, and the source/drain electrode of the p-type MOS TFT are defined simultaneously in one photolithography step. The contact holes and the source/drain electrode of the n-type MOS TFT are also defined simultaneously in one photolithography step. The invention employs only six photolithography steps to manufacture the metal oxide semiconductor, such as TFT, with lightly doped drain, thereby avoiding alignment errors, further improving yield and increasing throughput.

9 Claims, 15 Drawing Sheets

METHOD FOR FABRICATING METAL OXIDE SEMICONDUCTOR WITH LIGHTLY DOPED DRAIN

BACKGROUND

The invention relates to methods for fabricating metal oxide semiconductors and, more particularly, to metal oxide semiconductors with lightly doped drain.

Thin film transistors (TFT) drive pixels in active matrix liquid crystal displays, active matrix organic light-emitting displays, image sensors and the like. Generally, TFT used in these apparatuses are formed of silicon semiconductor thin film. Such silicon semiconductor thin films are roughly classified into two types: amorphous silicon (a-Si) semiconductor and crystalline silicon semiconductor films.

The advantage of the crystalline silicon TFT is that the surface of a crystalline silicon layer has fewer defects than the amorphous silicon, thus the crystalline silicon TFT has a higher mobility. Currently crystalline silicon TFT is being substituted for amorphous silicon TFT in the fabrication of precise elements and pixel arrays. Compared to amorphous silicon TFT, more process steps are required to form crystalline silicon TFT. Hence, the process is more complicated and time-consuming.

FIGS. 1a to 1h are cross sections of the manufacturing process of a conventional complementary metal-oxide semiconductor. First, referring to FIG. 1a, a substrate 10 with a passivation layer 11 and an amorphous silicon layer 12 thereon is provided. The amorphous silicon layer 12 is crystallized to form a crystalline silicon layer 13, and the crystalline silicon layer 13 is patterned by photolithography to form silicon islands 13n and 13p, as shown in FIG. 1b.

Referring to FIG. 1c, a first patterned mask layer 20 is formed on the substrate 10, exposing a part of the silicon island 13n. Next, the first mask layer 20 is used to form an $n^+$ poly-silicon region 18n by n-type ion implantation of the exposed silicon island 13n.

In FIG. 1d, after removal of the first mask layer 20, a second patterned mask layer 21 is formed on the substrate 10, exposing the $n^+$ poly-silicon region 18n and a portion of the silicon island 13n adjacent to the $n^+$ poly-silicon region 18n. Next, the second mask layer 21 is used to form an $n^-$ poly-silicon region 28 by n-type ion light implantation of the exposed portion of the silicon island 13n adjacent to the $n^+$ poly-silicon region 18n.

In FIG. 1e, after removal of the second mask layer 21, a third patterned mask layer 22 is formed on the substrate 10, exposing a part of the silicon island 13p. Next, the third mask layer 22 is used to form a $p^+$ poly-silicon region 18p by p-type ion implantation of the exposed silicon island 13p.

In FIG. 1f, after removing the third mask layer 22, an insulating film 15 and a conductive layer (not shown) are formed on the structure. The conductive layer is then patterned by photolithography to form gate electrodes 16n and 16p. The gate electrodes 16n and 16p are formed respectively on channel regions 19n and 19p.

Referring to FIG. 1g, a silicon oxide layer 30 is formed on the structure and etched by photolithography, forming contact holes 30a. Then, referring to FIG. 1h, a metal layer is patterned by photolithography to form source/drain contact regions 35 in the contact holes 30a.

Referring to FIG. 1i, a protection layer 40 is formed on the above structure and patterned by photolithography to form contact holes 40a exposing source/drain contact regions 35.

Finally, a transparent conductive film is formed and patterned to provide a pixel electrode 50, filling the contact holes 40a.

The conventional fabrication method described requires nine photolithography steps, which increases costs and lowers throughput and yield.

Thus, a crystalline silicon TFT manufacturing process requiring fewer photolithography steps has been disclosed. FIGS. 2a to 2f are schematic views showing such a crystalline silicon TFT manufacturing process. First, referring to FIG. 2a, a substrate 100 is provided. Next, a buffer layer 105, crystalline silicon islands 110n and 110p, an insulating layer 120, and a conductive layer 130 are sequentially formed on the substrate 100.

Next, referring to FIG. 2b, the conductive layer 130 is etched by photolithography, using a first mask layer 140 acting as mask, to form a gate electrode 132p of p-type TFT. Next, the crystalline silicon island 110p is subjected to a p-type ion implantation, with the first mask layer 140 and the gate electrode 132p acting as masks, to form a $p^+$ poly-silicon region 180p.

Next, referring to FIG. 2c, after removal of the first mask layer 140, the conductive layer 130 of the n-type TFT is etched using a second mask layer 150 acting as mask, to form a gate electrode 132n of the n-type TFT. Next, the crystalline silicon island 110n is subjected to a n-type ion implantation, with the second mask layer 150 and the gate electrode 132n acting as masks, to form a $n^+$ poly-silicon region 180n.

Next, referring to FIG. 2d, the second mask layer 150 on the gate electrode 132n is etched isotropically to remove a predetermined width thereof. The gate electrode 132n is then etched, with the remaining second mask layer 150a acting as mask, to form a smaller gate electrode 132n'. Next, the crystalline silicon island 110n is subjected to a n-type light ion implantation, with the gate electrode 132n' acting as mask, to form a $n^-$ poly-silicon region 184.

Next, referring to FIG. 2e, the second mask layers 150 and 150a are removed. A first oxide layer 151 with first contact holes 160 is formed by photolithography. Next, source and drain contacts 162 are formed, filling the first contact holes 160. Referring to FIG. 2f, a second oxide layer 182 with a second contact hole 170 is formed on the structure. Finally, a pixel electrode 190 is formed, filling the second contact hole 170 by patterning a transparent electrode.

The fabrication method requires fewer photolithography steps. It is, however, critical to form the smaller second mask layer 150a by etching. That is, the narrow process window of the conventional crystalline silicon TFT increases the difficulty of manufacture.

Therefore, on the premise that the process window is unlimited and the process complexity is not increased, a metal oxide semiconductor, such as TFT, manufacturing process with fewer photolithography steps is called for.

SUMMARY

Embodiments of the invention provide a method of fabricating a metal oxide semiconductor with lightly doped drain. A substrate with a p-type MOS TFT region and an LDD region is provided. A first semiconductor island is formed in the LDD region, and a second semiconductor island is formed in the p-type MOS TFT region, wherein the first semiconductor island comprises a channel region, predetermined lightly doped regions, and a predetermined source/drain region, and the second semiconductor island comprises a channel region and a predetermined source/ drain region. A gate insulating layer and a conductive layer are formed on the substrate sequentially. A first patterned mask layer is formed directly on the conductive layer over the first semiconductor island and the channel region of the second semiconductor island, wherein the first patterned mask layer over the channel regions of the first and second semiconductor island is thicker than the first patterned mask layer over the predetermined lightly doped regions and predetermined source/drain region of the first semiconductor island. The conductive layer is then etched, with the first patterned mask layer acting as mask, forming a patterned first conductive layer. A heavily doped p-type ion implantation is performed on the predetermined source/drain region of the second semiconductor islands to form a source/drain electrode in the p-type MOS TFT region. The patterned conductive layer is removed from the predetermined lightly doped regions and predetermined source/drain region of the first semiconductor island. A lightly doped n-type ion implantation is performed on the predetermined lightly doped regions of the first semiconductor island to form lightly doped regions. The remaining first patterned mask layer is removed. A dielectric layer is formed on the substrate and etched to form a via hole and a blind hole, wherein the via hole exposes the predetermined source/drain region of the first semiconductor islands, and the blind hole is formed above the source/drain electrode in the p-type MOS TFT region. A heavily doped n-type ion implantation is performed on the predetermined source/drain region of the first semiconductor islands to form a source/drain electrode in the LDD region through the via hole.

The invention also provides a liquid crystal display comprising the metal oxide semiconductor fabricated above.

A detailed description is given in the following with reference to the accompanying drawing.

BRIEF DESCRIPTION OF THE DRAWINGS

The invention can be more fully understood by reading the subsequent detailed description in conjunction with the examples and references made to the accompanying drawings, wherein.

DETAILED DESCRIPTION

In the manufacturing process of the invention, the gate electrode, the LDD of the n-type MOS TFT, and the source/drain electrode of the p-type MOS TFT are defined simultaneously in one photolithography step. Furthermore, the contact holes and the source/drain electrode of the n-type MOS TFT are also defined simultaneously in one photolithography step. The present invention employs only six photolithography steps to manufacture the metal oxide semiconductor, such as TFT, with lightly doped drain, fewer than conventional process, avoiding alignment errors, further improving yield, and increasing throughput.

Figure 1A:
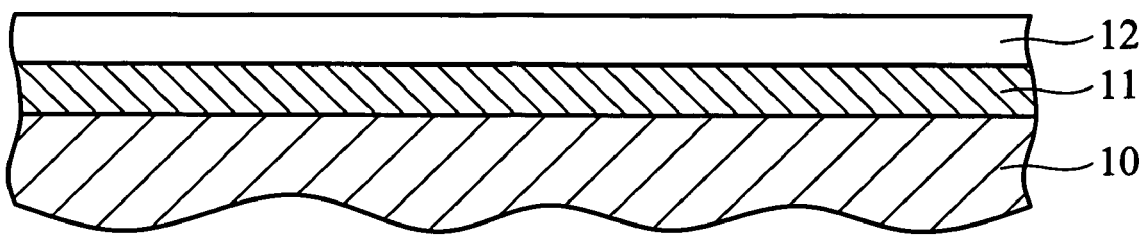
FIGS. 1a to 1i are cross sections of a conventional manufacturing process for a complementary metal-oxide semiconductor.
Figure 1B:
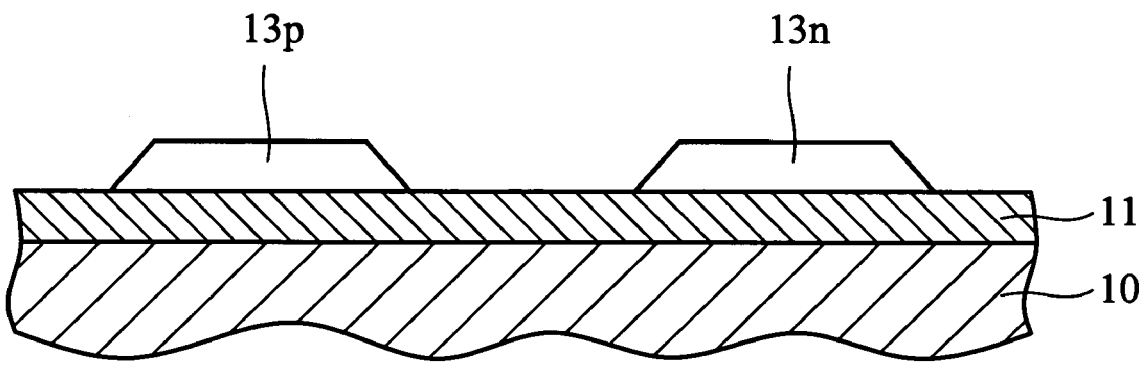
Figure 1C:
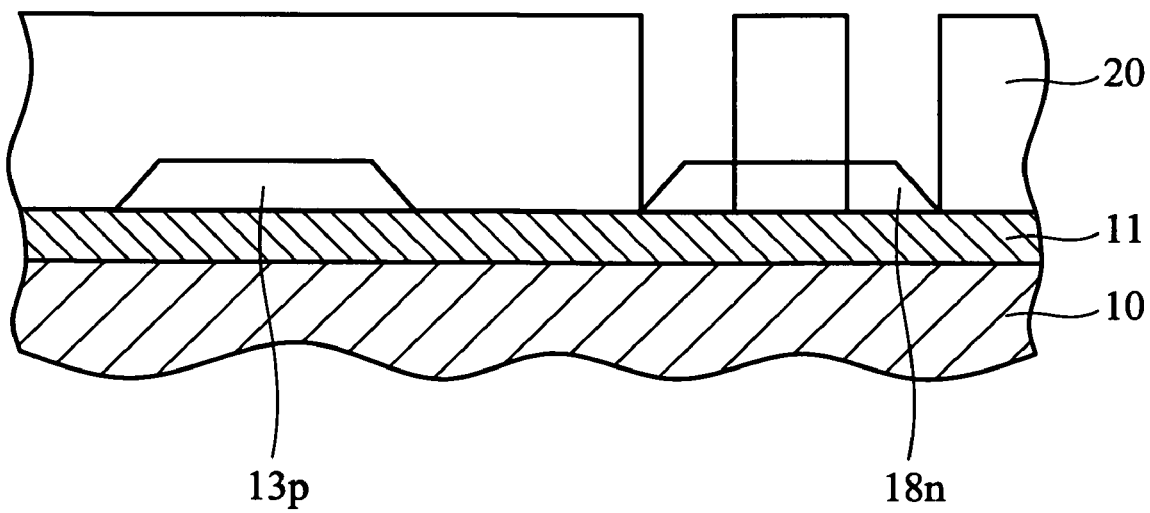
Figure 1D:
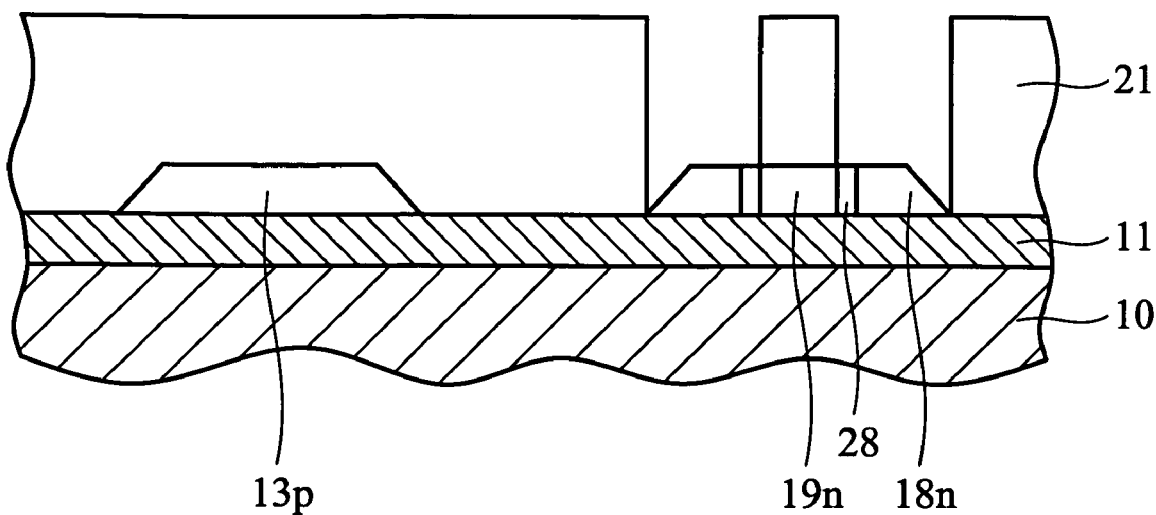
Figure 1E:
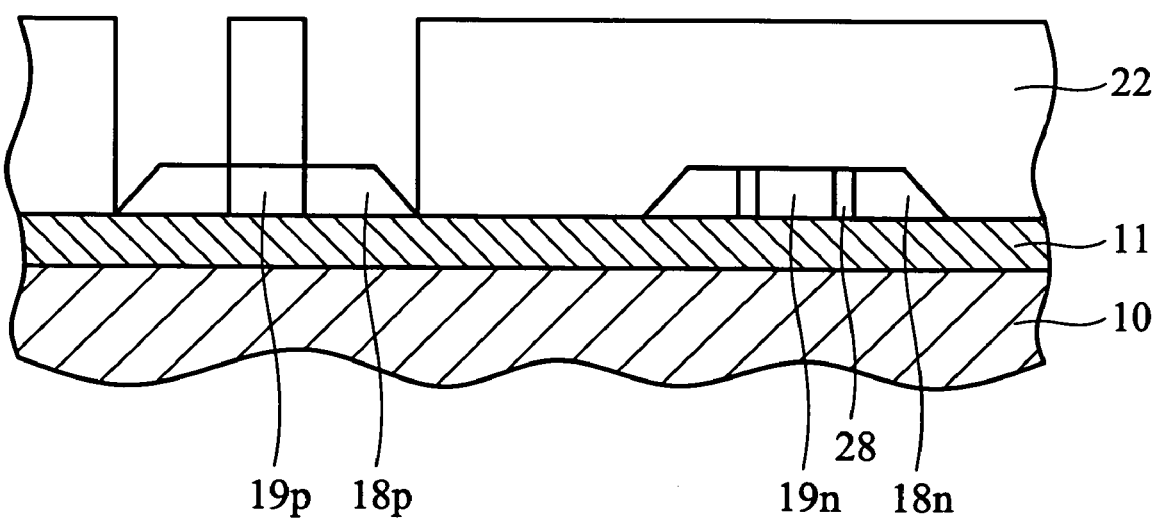
Figure 1F:
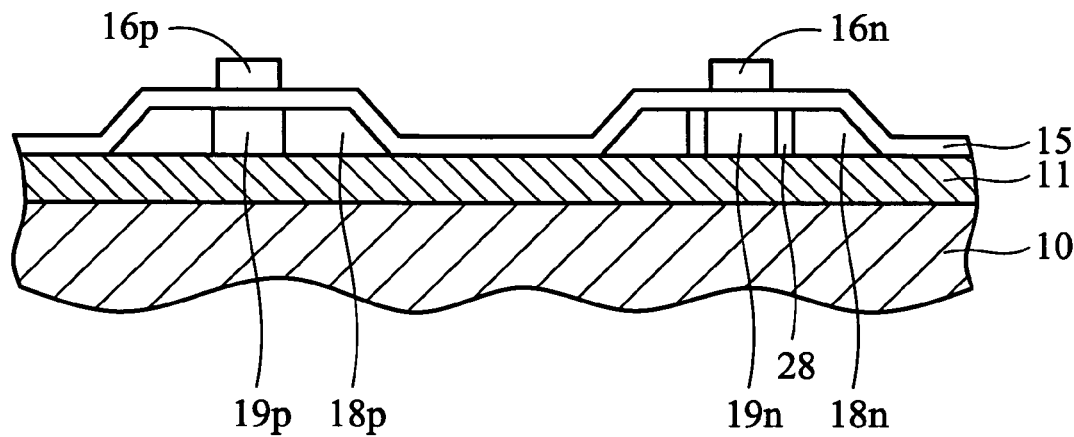
Figure 1G:
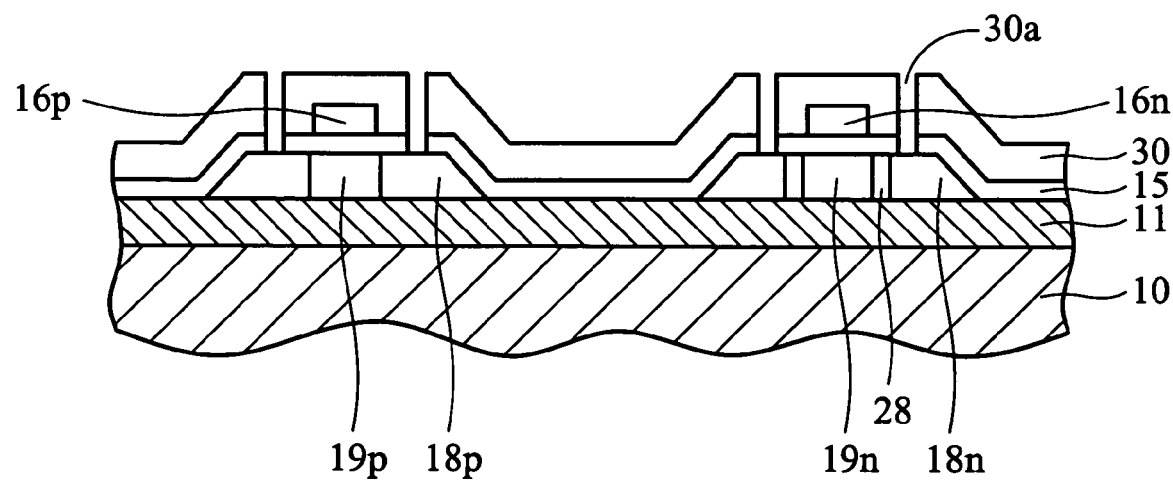
Figure 1H:
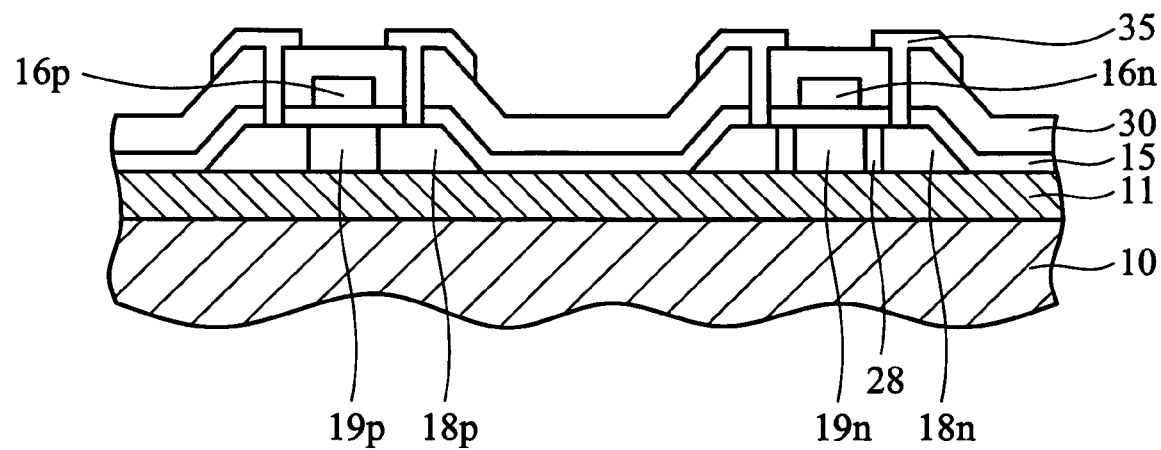
Figure 1I:
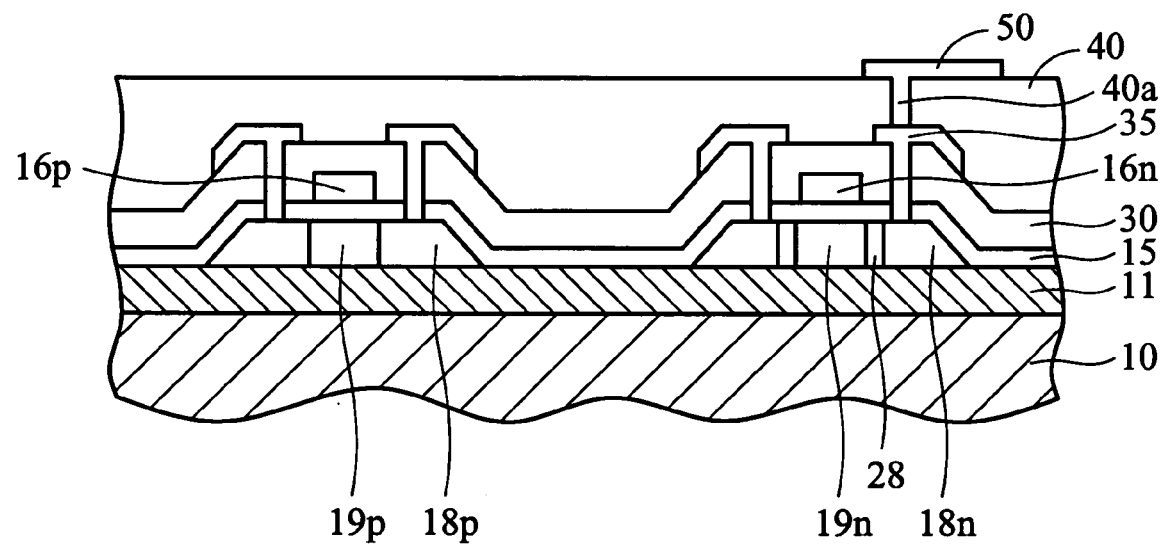
Figure 2A:
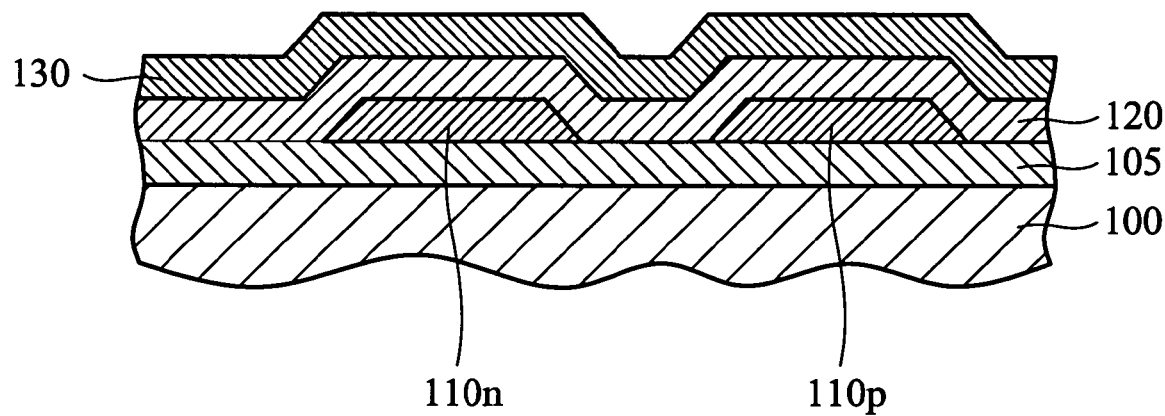
FIGS. 2a to 2f are cross-sections of a conventional manufacturing process for TFT.
Figure 2B:
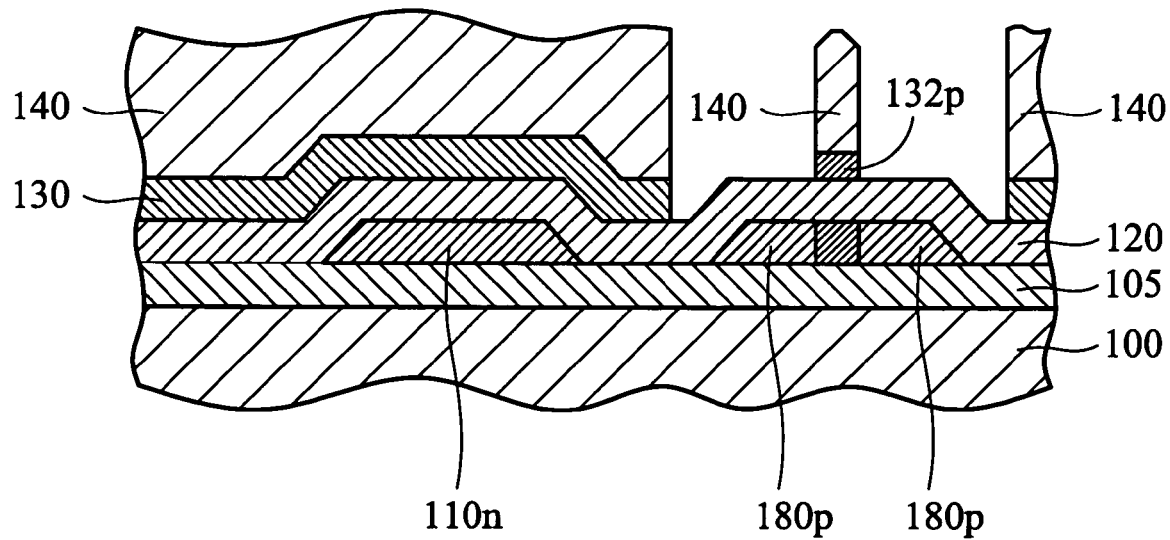
Figure 2C:
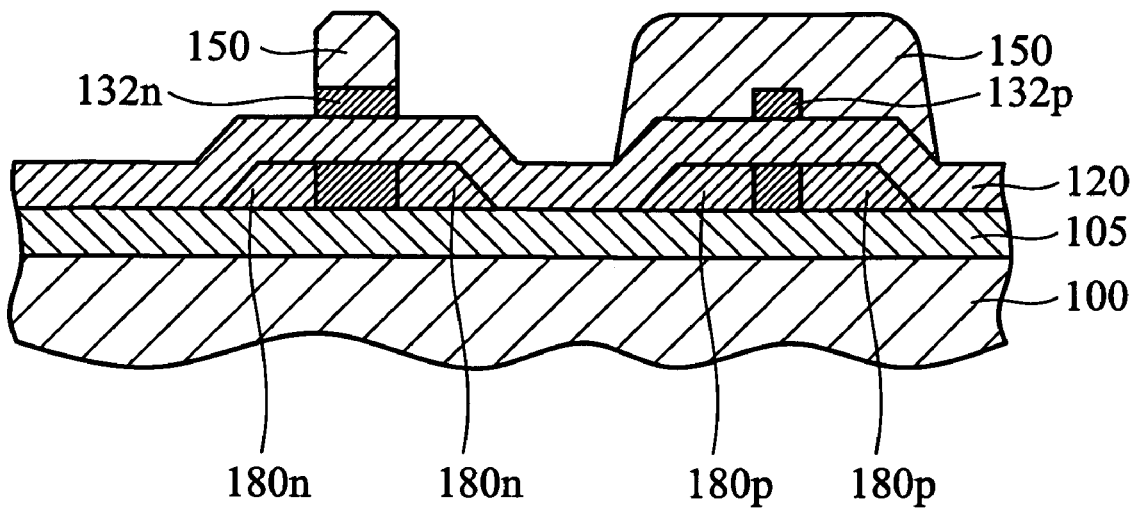
Figure 2D:
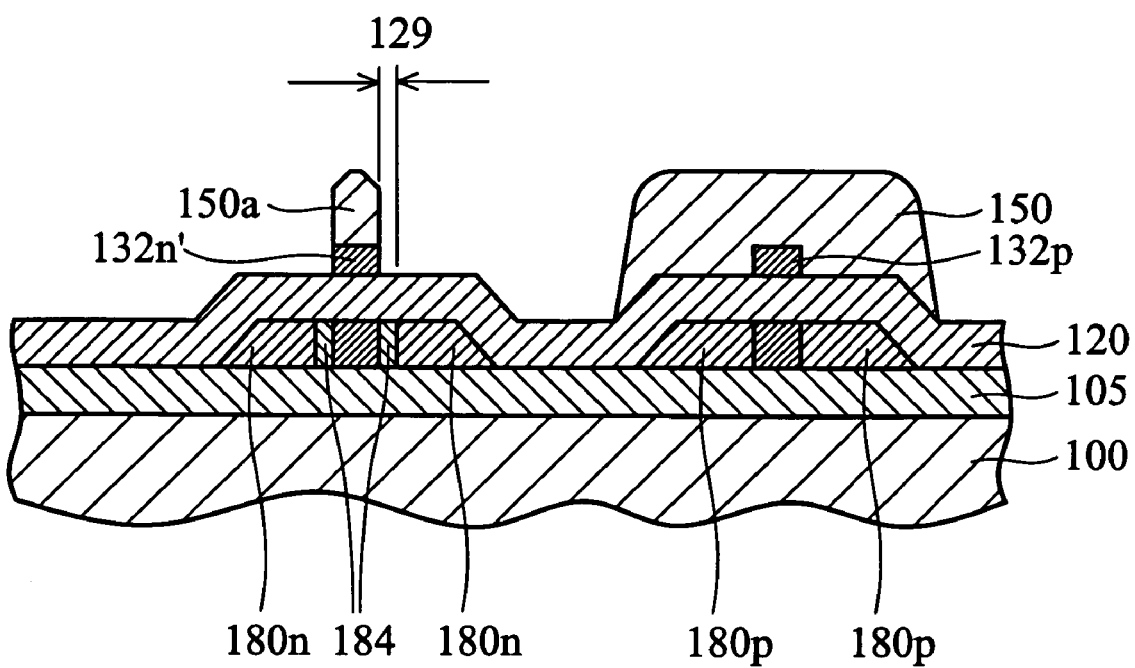
Figure 2E:
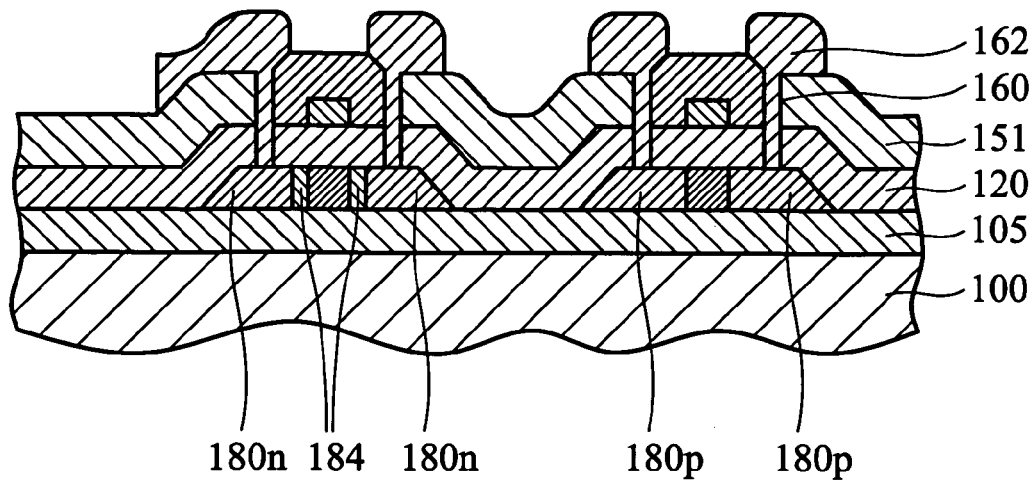
Figure 2F:
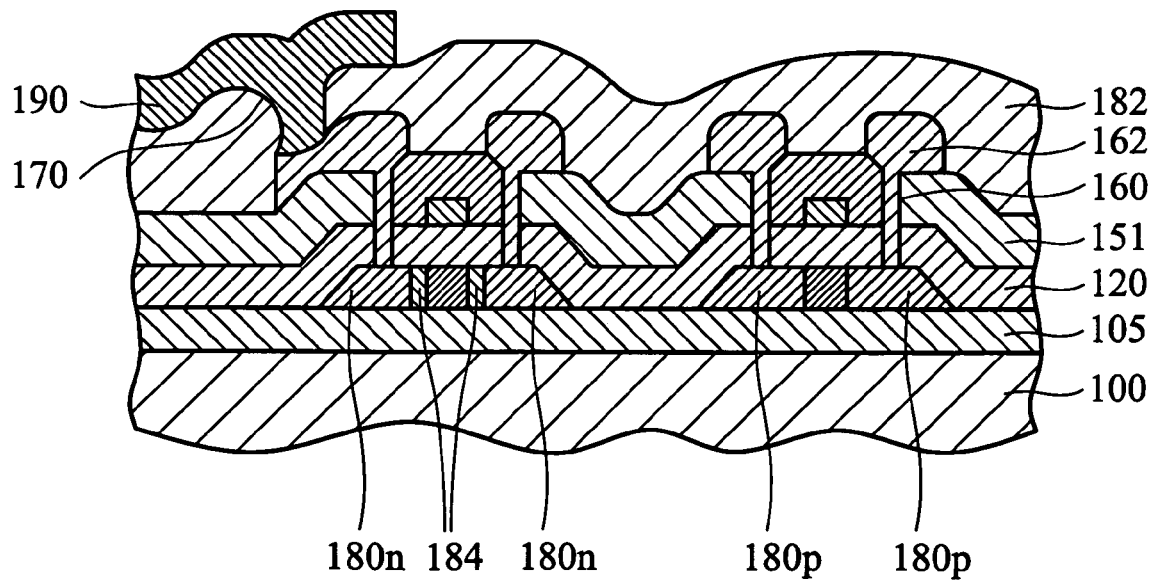
Figure 3A:
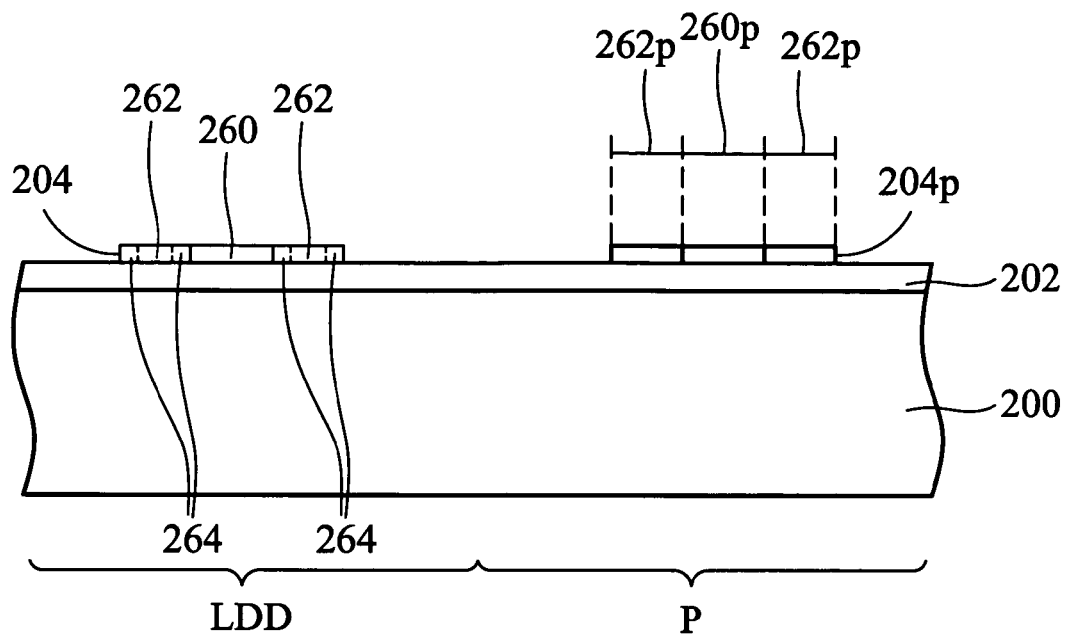
FIGS. 3a to 3m are cross-sections showing a method of fabricating a complementary metal-oxide semiconductor according to embodiments of the invention.

First, referring to FIG. 3a, a substrate 200 with a p-type MOS TFT region P and an LDD region LDD is provided. The substrate 200 is an insulating substrate, such as glass substrate or quartz substrate. Next, a buffer layer 202 and a semiconductor layer (not shown) are sequentially formed on the substrate 200. Next, the semiconductor layer is patterned by a first photolithography step to form a first semiconductor island 204 in the LDD region LDD and a second semiconductor island 204p in the p-type MOS TFT region P, wherein the first semiconductor island 204 defines as a channel region 260, predetermined lightly doped regions 264, and predetermined source/drain region 262, and the second semiconductor island 204p defines as a channel region 260p, and a predetermined source/drain region 262p. Suitable material for the buffer layer 202 is silicide, such as silicon nitride. The semiconductor layer is a silicon-containing layer, such as polysilicon, single crystal silicon, or amorphous silicon. For example, a polysilicon layer can be an amorphous silicon layer treated by thermal application or excimer laser annealing (ELA) to crystallize the amorphous silicon layer through solid or liquid phase growth.

Figure 3B:
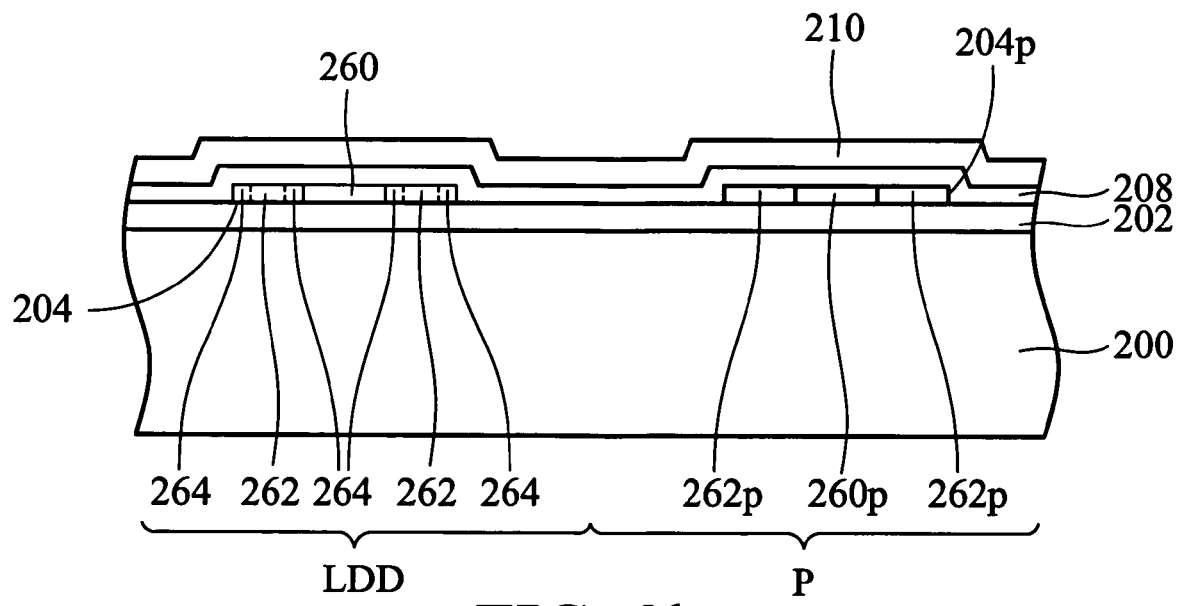

Next, referring to FIG. 3b, a gate insulating layer 208 and a first conductive layer 210 are formed sequentially on the substrate 200, covering the first semiconductor island 204 and the second semiconductor island 204p. The gate insulating layer 208, such as silicon oxide, can be of a thickness of about 50 nm to 200 nm, preferably 80 nm to 150 nm. Suitable material for the first conductive layer 210 is Al, Ti, Ta, Cr, Mo, MoW or alloys thereof, formed by, for example, deposition, sputtering or vacuum evaporation.

Figure 3C:
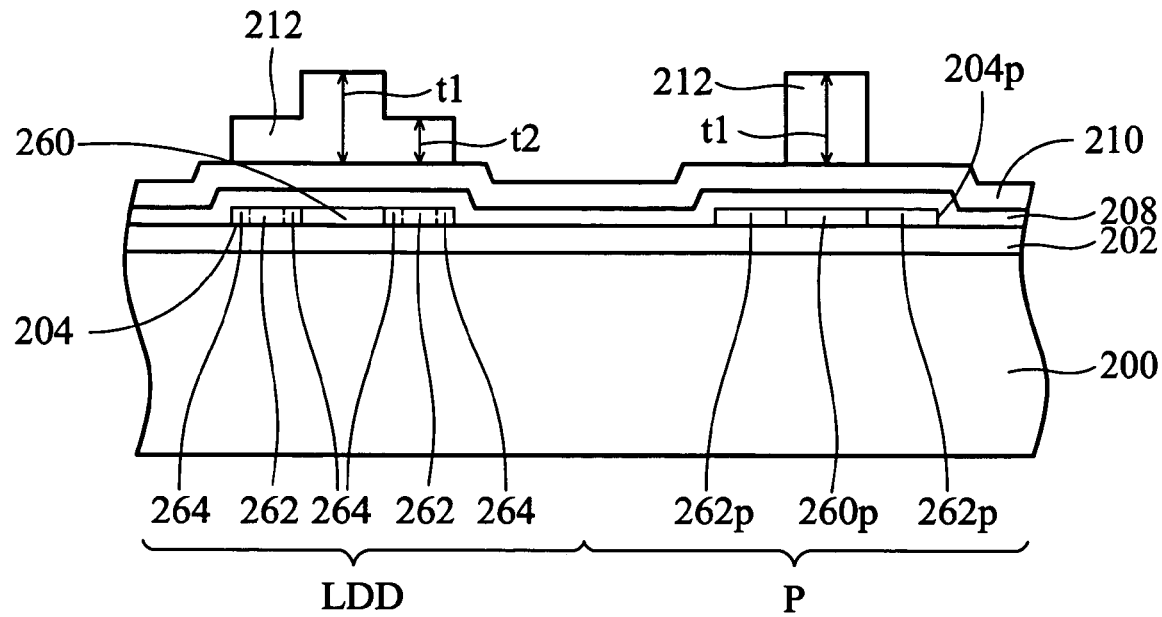

Next, referring to FIG. 3c, a first patterned mask layer 212 is formed by a second photolithography step directly on the first conductive layer 210 over the first semiconductor island 204 and the channel region 262p of the second semiconductor island 204p. It should be noted that the first patterned mask layer 212 is designed to be of variable thickness. The first patterned mask layer 212 formed over the channel regions 260 and 260p of the first and second semiconductor islands 204 and 204p is a first thickness t1, and the first patterned mask layer 212 formed over the predetermined lightly doped regions 264 and predetermined source/drain region 262 of the first semiconductor islands 204 a second thickness t2. The ratio between the first thickness t1 and second thickness t2 is 10:9 to 3:1. The first patterned mask layer 212 of variable thickness can be formed by the second photolithography step employing a halftone mask.

Figure 3D:
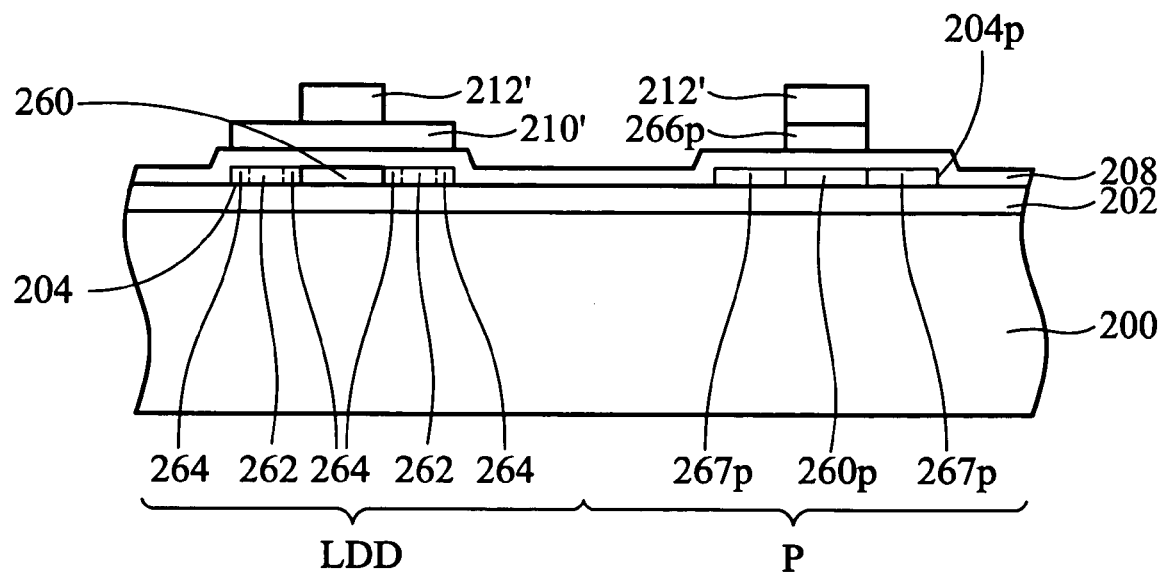

Next, referring to FIG. 3d, the first conductive layer 210 exposed by the first mask layer 212 is removed by an anisotropic etching process, with the first patterned mask layer acting as mask, forming a first patterned conductive layer 210' on the first semiconductor island 204 and a gate electrode 266p over the channel region 260p of the second semiconductor island 204p. Here, after etching, the first mask layer 212 of second thickness t2 is completely removed, and the first mask layer 212' over the channel regions 260 and 260p of the first and second semiconductor islands 204 and 204p remains. Next, a heavily doped p-type ion implantation is performed on the predetermined source/drain region 262p of the second semiconductor islands 204p with the first patterned conductive layer 210' and the gate electrode 266p acting as a mask, forming source/drain electrode 267p in the p-type MOS TFT region P. Here, the ion dosage of the heavily doped p-type ion implantation is more than a hundred times that of the subsequent lightly doped n-type ion implantation.

Figure 3E:
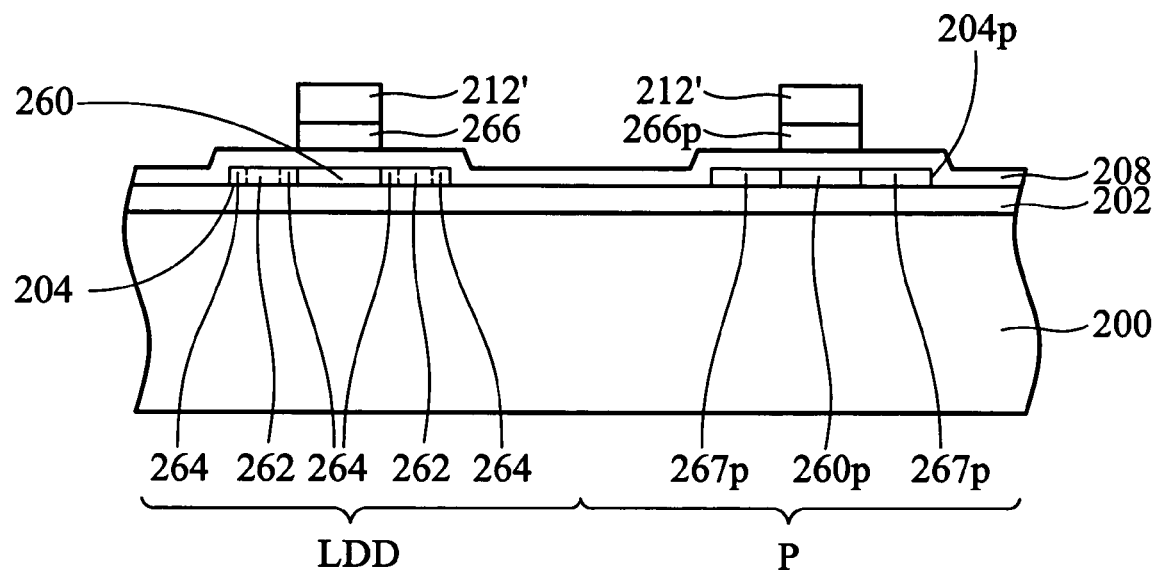
Figure 3F:
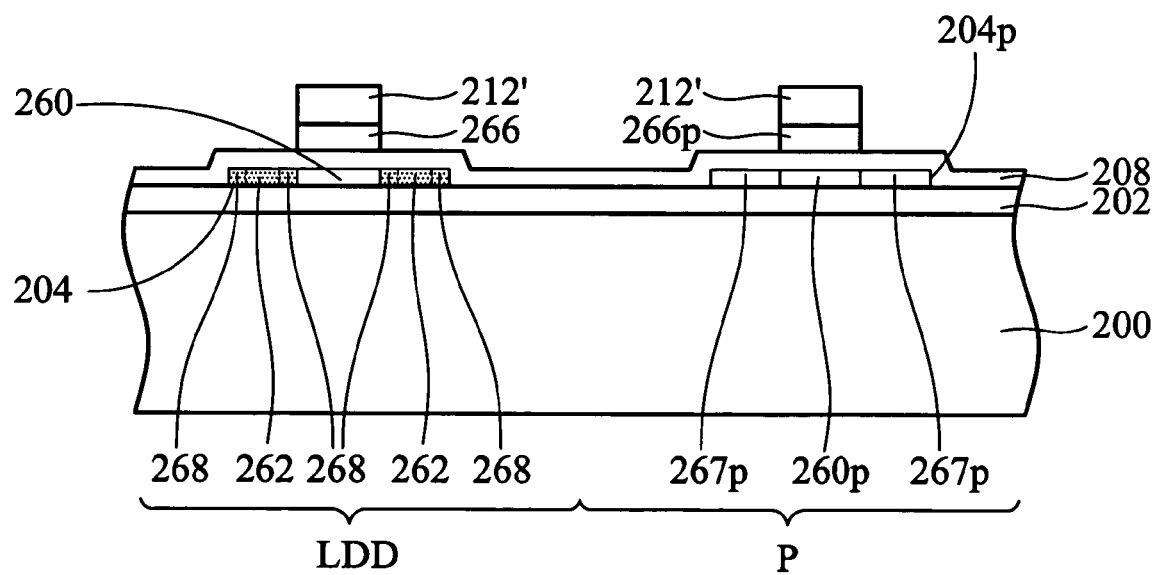

Next, referring to FIG. 3e, the patterned conductive layer 210' is etched, with the gate insulating layer 208 acting as an etch stopper and the remaining first mask layer 212' as a mask, forming a gate electrode 266 in the LDD region LDD. Next, a lightly doped n-type ion implantation is performed on the predetermined lightly doped regions 264 of the first semiconductor island 204, with the gate electrode 266 as mask, to form lightly doped regions 268, referring to FIG. 3f. Since the ion dosage of the heavily doped p-type ion implantation is more than a hundred times that of the lightly doped n-type ion implantation, the electric characteristics of the source/drain electrode 267p are unaffected by the lightly doped n-type ion implantation.

Figure 3G:
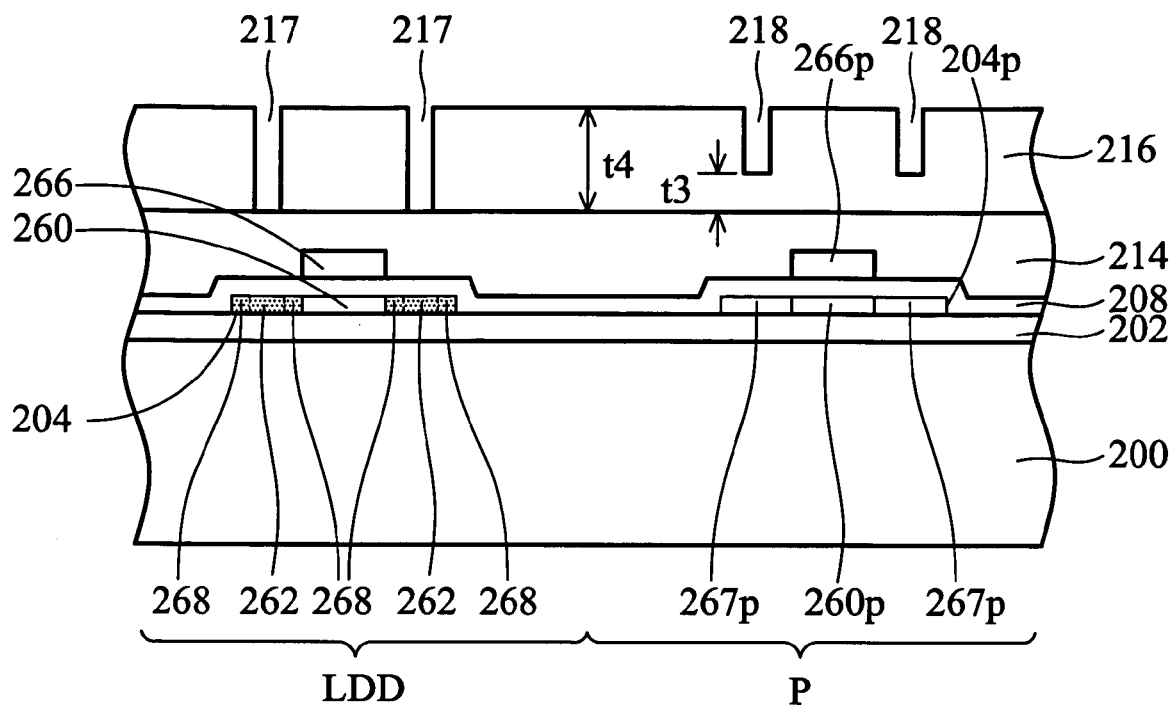

Next, referring to FIG. 3g, the remaining first mask layer 212' is removed, and a dielectric layer 214 is then formed on the above structure. The dielectric layer 214 can be the same as the gate insulating layer, such as silicon nitride or silicon oxide, of a thickness of 300 nm to 500 nm. Next, a second patterned mask layer 216 of variable thickness is formed on the dielectric layer 214 by a third photolithography step, wherein the second patterned mask layer 216 has a first opening exposing the dielectric layer 214 over the predetermined source/drain region 262 in the LDD region LDD and a second opening not exposing the dielectric layer 214 over the source/drain electrode 267p in the p-type MOS TFT region P. Namely, the second patterned mask layer 216 formed over the source/drain electrode 267p in the p-type MOS TFT region P has a third thickness t3, and the other has a fourth thickness t4. The ratio between the third thickness t4 and the fourth thickness t3 is 10:3 to 3:1. The second patterned mask layer 216 of variable thickness can be formed by the third photolithography step employing a halftone mask. Particularly, the first opening 217 corresponds to the predetermined source/drain region 262, and the horizontal distance between the first opening 217 and the channel region 260 of the first semiconductor layer is 0.4~1.0 μm, such as 0.75 μm.

Figure 3H:
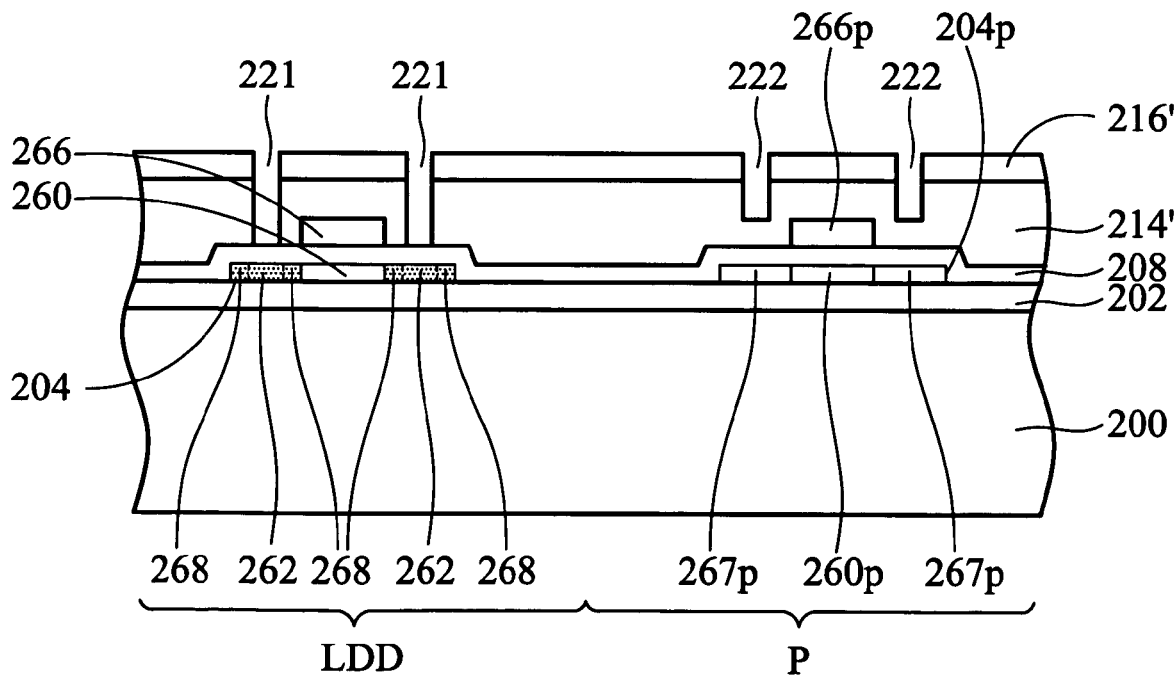

Next, referring to. FIG. 3h, the dielectric layer 214 and the second patterned mask layer 216 are etched, with the second patterned mask layer 216 acting as a mask, forming a via hole 221, a blind hole 222, and a remaining second patterned mask layer 216' without via hole 221 and blind hole 222. The via hole 221 passes through the dielectric layer 214, exposing the predetermined source/drain region 262 of the first semiconductor islands 204, and the blind hole 222 is disposed in the dielectric layer 214 over the source/drain electrode 267p in the p-type MOS TFT region P. In the etching step, the dielectric layer 214 exposed by the first opening 217 (i.e. the dielectric layer 214 over the predetermined source/drain region 262 of the first semiconductor islands 204) is completely removed, and the dielectric layer 214 under the second opening 218 (i.e. the dielectric layer 214 over the source/drain electrode 267p in the p-type MOS TFT region P) is partially removed to form the blind hole 222 and leave the dielectric layer at a specific thickness. Particularly, the remaining dielectric layer over the source and drain electrodes 267p must be thick enough to prevent the electrical characteristics of the source/drain electrode 267p from the effects of subsequent heavily doped n-type ion implantation.

Figure 3I:
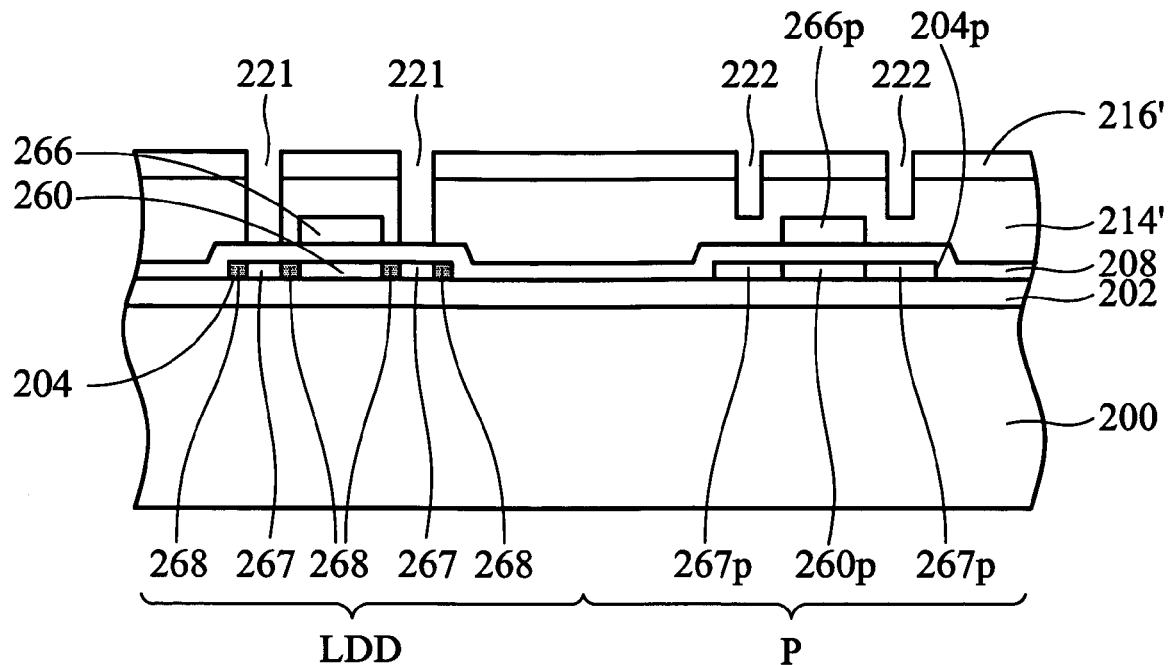
Figure 3J:
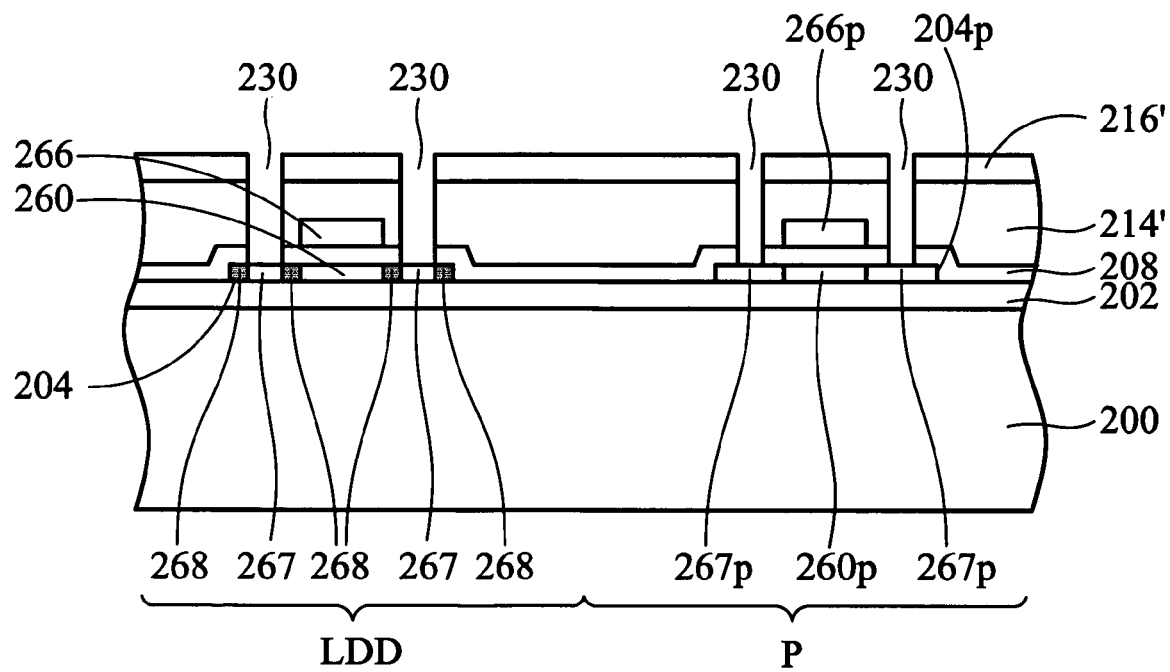

Next, referring to FIG. 3i, a heavily doped n-type ion implantation is performed on the predetermined source/drain region 262 of the first semiconductor island 204, with the dielectric layer 214 as mask, to form source/drain electrode 267 in the n-type MOS TFT region. Next, the dielectric layer 214 and the gate insulating layer 208 are etched via the via hole 221 and the blind hole 222, with the source/drain electrode 267 and 267p acting as a mask, forming first contact holes 230, referring to FIG. 3j.

Figure 3K:
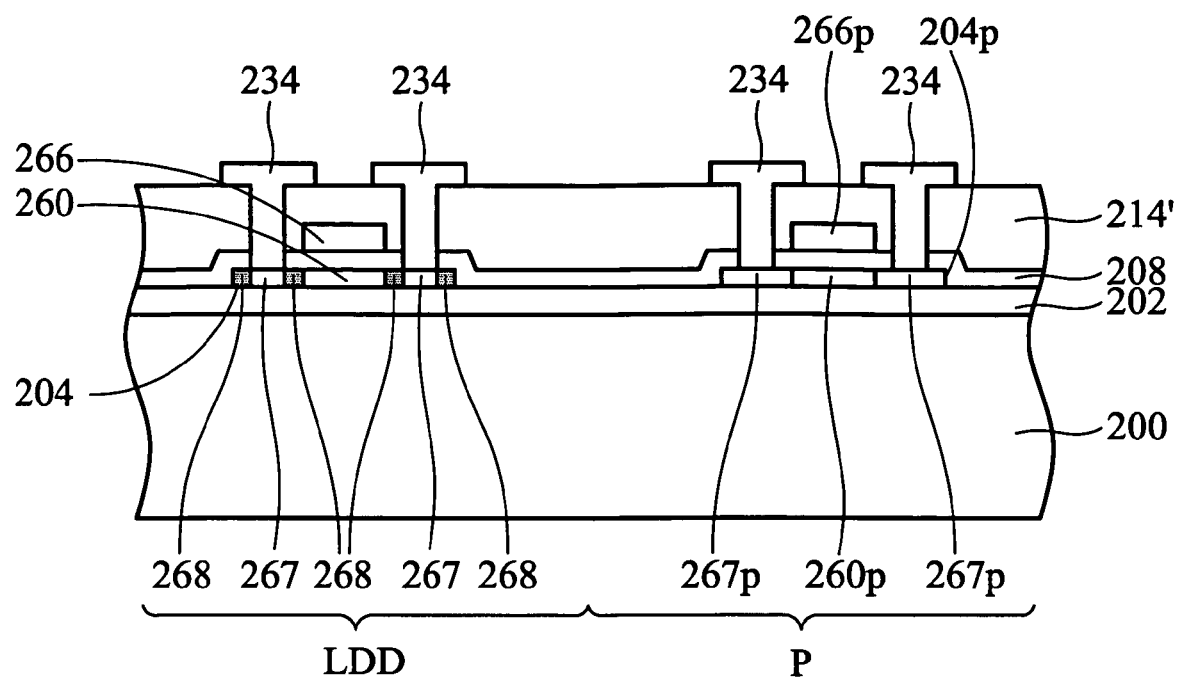

Next, referring to FIG. 3k, a second conductive layer (not shown) is formed on the dielectric layer 214, filling the first contact hole 230. The second conductive layer is then patterned by a fourth photolithography step to form source and drain contacts 234.

Figure 3L:
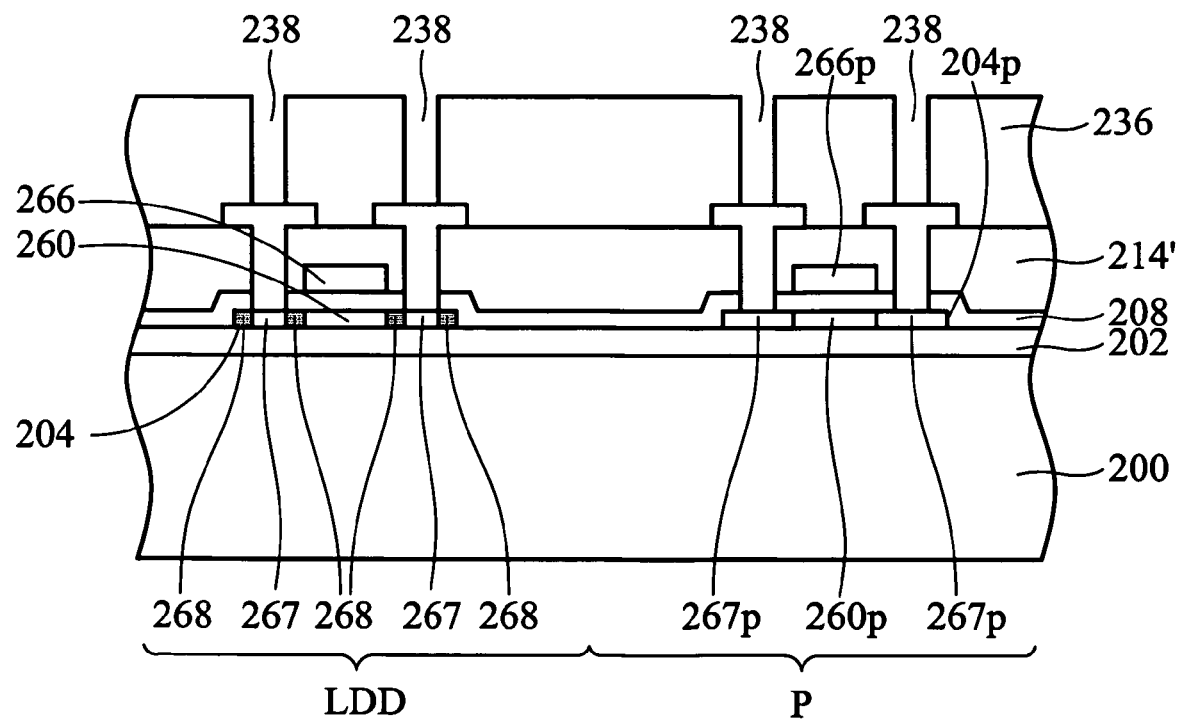
Figure 3M:
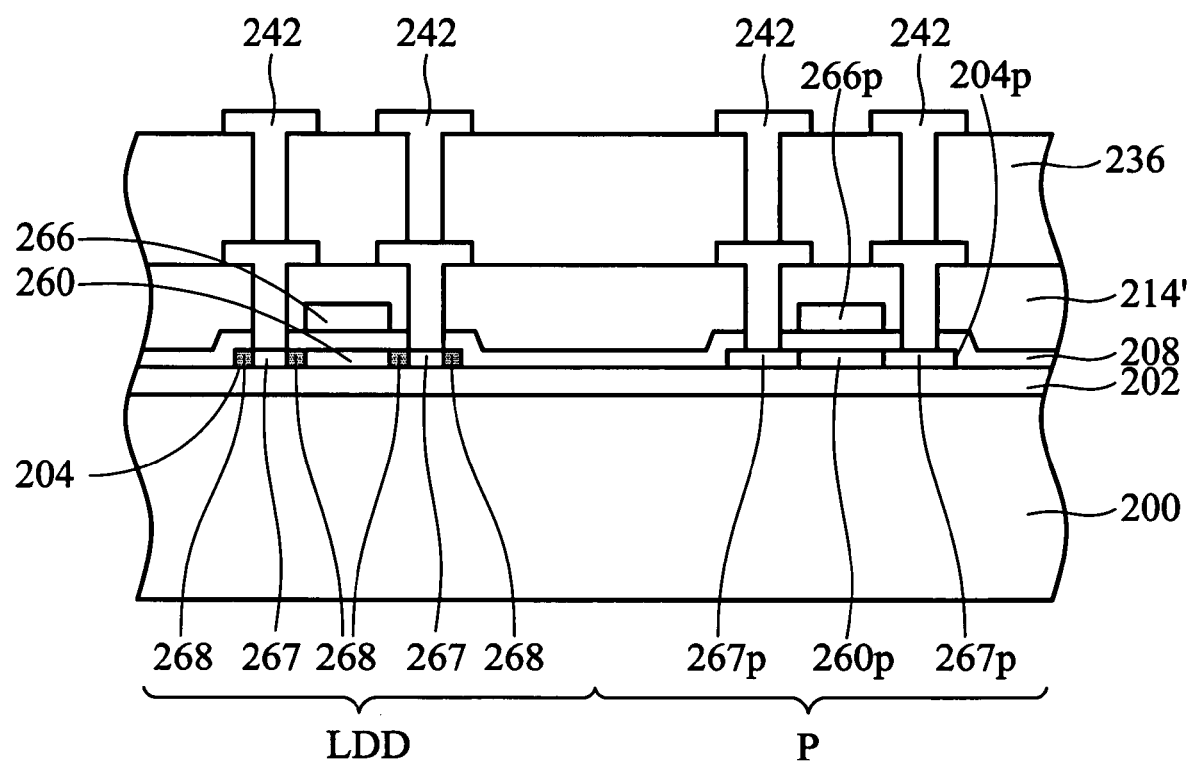

Next, referring to FIG. 3l, a protection layer 236 is formed on the dielectric layer 214 and patterned by a fifth photolithography step to form second contact holes 238 exposing the source and drain contacts 234. A transparent electrode (not shown) is then formed on the protection layer 236, filling into the second contact holes 238. Finally, the transparent electrode is patterned by a sixth photolithography step to form pixel electrodes 242 as shown in FIG. 3m, thus completing the fabrication of the metal oxide semiconductor in six photolithography steps.

Figure 4A:
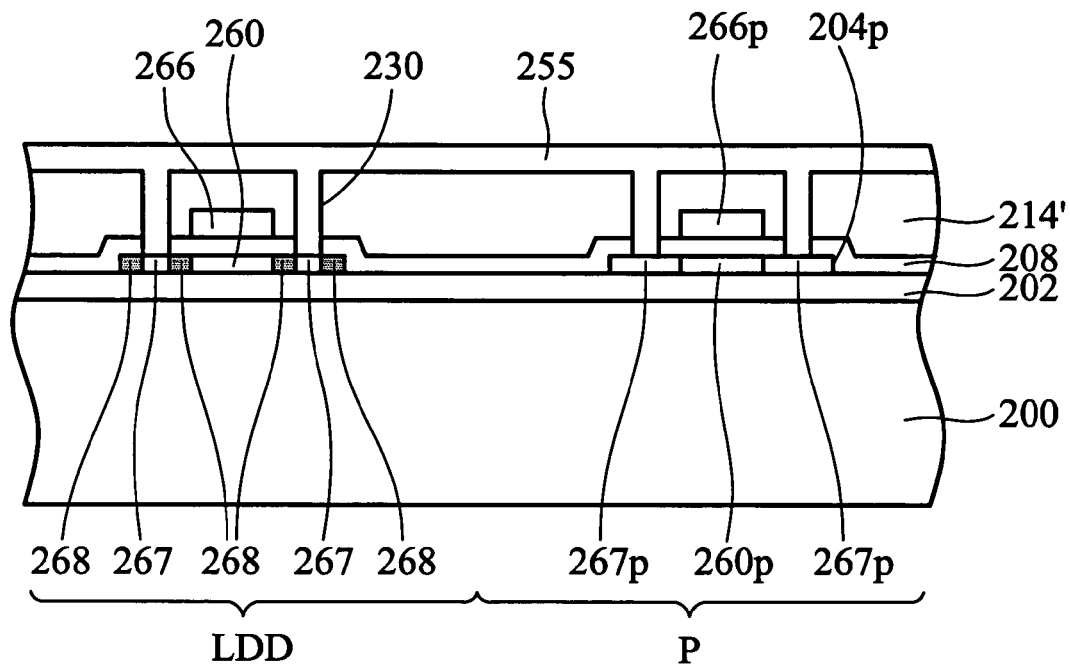
FIGS. 4a and 4b are cross-sections showing a method of fabricating a complementary metal-oxide semiconductor according to embodiments of the invention.
Figure 4B:
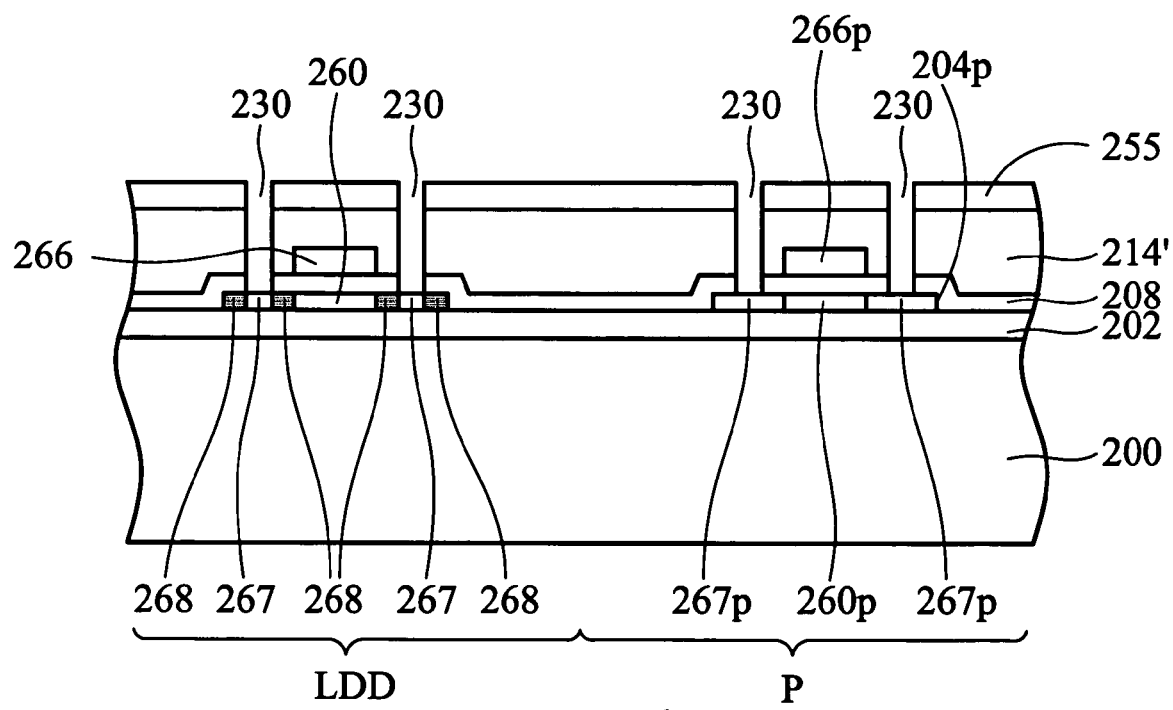

The method for fabricating metal oxide semiconductor with lightly doped drain, after n-type ion implantation shown in FIG. 3i, can further comprise a silicon nitride layer 255 formed on the dielectric layer 214, filling the first contact holes 230, as shown in FIG. 4a. Next, the structure is subjected to a thermal process, such as a rapid thermal process (RTP), to rectify the defects induced by ion implantation. Here, the nitrogen atoms of the silicon nitride layer 255 can be driven into the interface between the dielectric layer 214 and the semiconductor islands 204 and 204p, thereby reducing dangling bonds and improving stability of the metal oxide semiconductor. Finally, the silicon nitride layer 255 is completely removed by etching, as shown in FIG. 4b.

Self-aligned implantation allows the invention to reduce by three the number of photolithography steps required, thereby improving yield and increasing throughput. Further, since ion implantation is performed after the formation of gate electrodes, critical dimension thereof is more easily controlled than in the conventional method, avoiding alignment errors.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:
1. A method for fabricating metal oxide semiconductor (MOS) with lightly doped drain (LDD), comprising:
providing a substrate with a p-type MOS TFT region and an LDD region defined thereon;
forming a first semiconductor island in the LDD region and a second semiconductor island in the p-type MOS TFT region, wherein the first semiconductor island comprises a channel region, a predetermined lightly doped regions and a predetermined source/drain region, and the second semiconductor island comprises a channel region and a predetermined source/drain region;
forming a gate insulating layer and a conductive layer on the substrate sequentially;
forming a first patterned mask layer directly on the conductive layer over the first semiconductor island and the channel region of the second semiconductor island, wherein the first patterned mask layer over the channel regions of the first and second semiconductor island is thicker than the first patterned mask layer over the predetermined lightly doped regions and predetermined source/drain region of the first semiconductor island;

etching the conductive layer to form a patterned conductive layer, with the first patterned mask layer acting as mask;

performing a heavily doped p-type ion implantation on the predetermined source/drain region of the second semiconductor island to form a source/drain electrode in the p-type MOS TFT region;

removing the patterned conductive layer over the predetermined lightly doped regions and predetermined source/drain region of the first semiconductor island;

performing a lightly doped n-type ion implantation on the predetermined lightly doped regions of the first semiconductor island, forming lightly doped regions;

removing a remaining first patterned mask layer;

forming a dielectric layer on the substrate;

etching the dielectric layer to form a via hole and a blind hole, wherein the via hole exposes the predetermined source/drain region of the first semiconductor island, and the blind hole is formed above the source/drain electrode in the p-type MOS TFT region; and performing a heavily doped n-type ion implantation on the predetermined source/drain region of the first semiconductor island, forming a source/drain electrode in the LDD region through the via hole.

2. The method as claimed in claim 1, further comprising, before forming a first semiconductor island and a second semiconductor island on the substrate, forming a buffer layer on the substrate.

3. The method as claimed in claim 1, wherein the ion dosage of the heavily doped p-type ion implantation is a hundred times more than that of the lightly doped n-type ion implantation.

4. The method as claimed in claim 1, wherein the first patterned mask layer is formed by using a halftone mask.

5. The method as claimed in claim 1, further comprising:
etching the dielectric layer and the gate insulating layer through the via hole and the blind hole to form a plurality of first contact holes, exposing at least part of the source/drain electrodes;
forming source and drain contacts in the first contact holes;
forming a protection layer on the substrate; forming second contact holes pass through the protection layer, exposing the source and drain contacts; and
forming a pixel electrode electrically connecting to the source/drain electrode through the source and drain contacts.

6. The method as claimed in claim 1, further comprising, after forming the first contact holes:
forming a silicon nitride layer on the substrate;
performing a thermal process on the substrate; and
removing the silicon nitride layer.

7. The method as claimed in claim 6, wherein the thickness of the silicon nitride layer is in the range between 500 Å and 2000 Å.

8. The method as claimed in claim 1, further comprising applying a second patterned mask layer with a step profile before etching the dielectric layer to form a via hole and a blind hole.

9. The method as claimed in claim 8, wherein the second patterned mask layer of variable thickness is formed by using halftone mask.

* * * * *